United States Patent
Hayashi et al.

(10) Patent No.: US 10,170,978 B1
(45) Date of Patent: Jan. 1, 2019

(54) SIGNAL TRANSMISSION CIRCUIT

(71) Applicant: DENSO CORPORATION, Kariya, Aichi-pref. (JP)

(72) Inventors: Yoshinori Hayashi, Kariya (JP); Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/061,253

(22) PCT Filed: Dec. 8, 2016

(86) PCT No.: PCT/JP2016/086612
§ 371 (c)(1),
(2) Date: Jun. 11, 2018

(87) PCT Pub. No.: WO2017/099191
PCT Pub. Date: Jun. 15, 2017

(30) Foreign Application Priority Data

Dec. 10, 2015 (JP) .................................. 2015-241101
Dec. 8, 2016 (JP) .................................. 2016-238287

(51) Int. Cl.
*H02M 1/092* (2006.01)
*H02M 7/5387* (2007.01)
(Continued)

(52) U.S. Cl.
CPC ............. *H02M 1/44* (2013.01); *H02M 1/088* (2013.01); *H02M 7/003* (2013.01); *H02M 7/53871* (2013.01); *H02P 27/08* (2013.01)

(58) Field of Classification Search
CPC .......... H02M 1/092; H02M 7/538466; H02M 7/5387; H02M 7/53875
(Continued)

(56) References Cited

U.S. PATENT DOCUMENTS

| 8,432,715 B2 * | 4/2013 | Fukuta | .................... H02M 1/36 363/132 |
| 2012/0025875 A1 * | 2/2012 | Fukuta | .................... H02M 1/08 327/109 |

(Continued)

FOREIGN PATENT DOCUMENTS

| JP | S57-118457 A | 7/1982 |
| JP | 2007-46511 A | 2/2007 |

(Continued)

OTHER PUBLICATIONS

Feb. 14, 2017 International Search Report issued in International Patent Application No. PCT/JP2016/086612.

*Primary Examiner* — Gary Nash
(74) *Attorney, Agent, or Firm* — Oliff PLC

(57) ABSTRACT

In a signal transmission circuit including a drive circuit and a control apparatus which are insulated from each other and between which a signal indicative of predetermined information is transmitted via a magnetic coupler, the drive circuit includes a temperature information transmission unit transmitting a first signal indicative of temperature information based on the number of pulses consecutively output with a predetermined period and each having a first waveform with a duty cycle of less than 100% with respect to the period and an abnormality information transmission unit transmitting a second signal indicative of abnormality information based on a pulse having a longer wavelength than the first waveform. The temperature information transmission unit transmits the first signal to the control apparatus and the abnormality information transmission unit transmits the second signal to the control apparatus, via the magnetic coupler common to two information transmission units.

9 Claims, 8 Drawing Sheets

(51) Int. Cl.
*H02M 1/44* (2007.01)
*H02M 1/088* (2006.01)
*H02M 7/00* (2006.01)
*H02P 27/08* (2006.01)

(58) Field of Classification Search
USPC ............ 363/55, 56.02, 78, 95, 98, 132, 137
See application file for complete search history.

(56) References Cited

U.S. PATENT DOCUMENTS

| | | | | |
|---|---|---|---|---|
| 2012/0286717 A1* | 11/2012 | Fukuta | ................. | B60L 11/123 318/722 |
| 2013/0181640 A1* | 7/2013 | Fukuta | ................. | H03K 17/166 318/139 |
| 2014/0055897 A1* | 2/2014 | Tsunekawa | .............. | H02H 3/20 361/86 |
| 2014/0062361 A1* | 3/2014 | Suzuki | .................... | H02M 1/08 318/400.17 |
| 2014/0092653 A1* | 4/2014 | Suzuki | .................... | H02M 1/08 363/55 |
| 2014/0217942 A1* | 8/2014 | Fukuta | ............. | H02M 7/53875 318/400.27 |
| 2014/0241740 A1 | 8/2014 | Naruse et al. | | |
| 2014/0285002 A1* | 9/2014 | Onishi | .................. | B60L 15/007 307/10.1 |
| 2014/0307492 A1* | 10/2014 | Suzuki | .................... | H02M 1/32 363/56.01 |
| 2014/0307495 A1* | 10/2014 | Fukuta | .................... | H02H 3/08 363/98 |
| 2014/0340948 A1* | 11/2014 | Suzuki | ................. | H02M 7/537 363/40 |

FOREIGN PATENT DOCUMENTS

| | | |
|---|---|---|
| JP | 2009-136115 A | 6/2009 |
| JP | 2010-273042 A | 12/2010 |

* cited by examiner

SIGNAL TRANSMISSION CIRCUIT

CROSS-REFERENCE TO RELATED APPLICATIONS

The present application is based on Japanese Application No. 2015-241101 filed on Dec. 10, 2015 and Japanese Patent Application No. 2016-238287 filed on Dec. 8, 2016, the contents of which are incorporated by reference herein.

TECHNICAL FIELD

The present disclosure relates to a signal transmission circuit including a transmission apparatus and a reception apparatus which are insulated from each other and between which a signal indicative of predetermined information is transmitted via an insulation element.

BACKGROUND ART

An inverter apparatus which drives an onboard electric motor constitutes a high-voltage system, and a control apparatus which controls the inverter apparatus constitutes a low-voltage system insulated from the high-voltage system. When a signal indicative of temperature information on switching elements constituting the inverter apparatus or abnormality information indicative of an abnormality in any of the switching elements is transmitted from the inverter apparatus to the control apparatus, the signal is transmitted from the high-voltage system to the low-voltage system. Since the high-voltage system and the low-voltage system are insulated from each other, signal transmission from the inverter apparatus to the control apparatus is performed via an insulation element.

PTL 1 describes a configuration which transmits a signal indicative of temperature information and a signal indicative of abnormality information via a common insulating terminal in order to reduce the number of insulation elements used.

CITATION LIST

Patent Literature

[PTL 1]: JP 2009-136115 A

SUMMARY OF THE INVENTION

In the configuration in PTL 1, the signal indicative of the abnormality information with a high degree of urgency has a lower time ratio (duty cycle) than the signal indicative of the temperature information. Thus, when noise is superimposed on the signals, the control apparatus (microcomputer) may fail to detect the abnormality information correctly.

The present disclosure has been provided in view of the above-described problems. An object of the present disclosure is to provide a signal transmission circuit including a transmission apparatus and a reception apparatus, the transmission apparatus transmitting a first signal indicative of first information and a second signal indicative of second information having a higher degree of urgency than the first information, to the reception apparatus via an insulation element common to the transmission apparatus and the reception apparatus, the signal transmission circuit suppressing adverse effects of noise.

The present configuration is a signal transmission circuit including a transmission apparatus and a reception apparatus which are insulated from each other and between which a signal indicative of predetermined information is transmitted via an insulation element, wherein the transmission apparatus includes a first transmission unit transmitting a first signal indicative of first information based on a number of pulses consecutively output with a predetermined period and having a first waveform with a duty cycle of less than 100% with respect to the period and a second transmission unit transmitting a second signal indicative of second information based on a pulse having a longer wavelength than the first waveform, the first transmission unit transmitting the first signal to the reception apparatus and the second transmission unit transmitting the second signal to the reception apparatus, via the insulation element common to the first transmission unit and the second transmission unit.

In the above-described configuration, the first information can be indicated based on the number of pulses having the first waveform with a duty cycle of less than 100%. The configuration allows the reception apparatus to receive the first signal indicative of the first information even when the reception apparatus has a simple configuration with no component detecting the wavelength (duration) of pulses. Moreover, each of the pulses included in the second signal indicative of the second information has a longer wavelength (longer duration) than each of the pulses included in the first signal indicative of the first information. Thus, even if noise is superimposed on the signals, the wavelength of each of the pulses included in the second signal can be made longer than the wavelength (duration) of the noise. Thus, even if noise is superimposed on the second signal, the reception apparatus can accurately acquire the second information indicated by the second signal. In other words, the signal transmission circuit can suppress the adverse effects of noise.

BRIEF DESCRIPTION OF THE DRAWINGS

The above-described and other objects, features, and advantages of the present disclosure will be more apparent from the following detailed description taken with reference to the accompanying drawings.

DESCRIPTION OF EMBODIMENTS

First Embodiment

An embodiment where a signal transmission circuit is employed in a power converter in a hybrid car will be described below with reference to the drawings.

Figure 1:
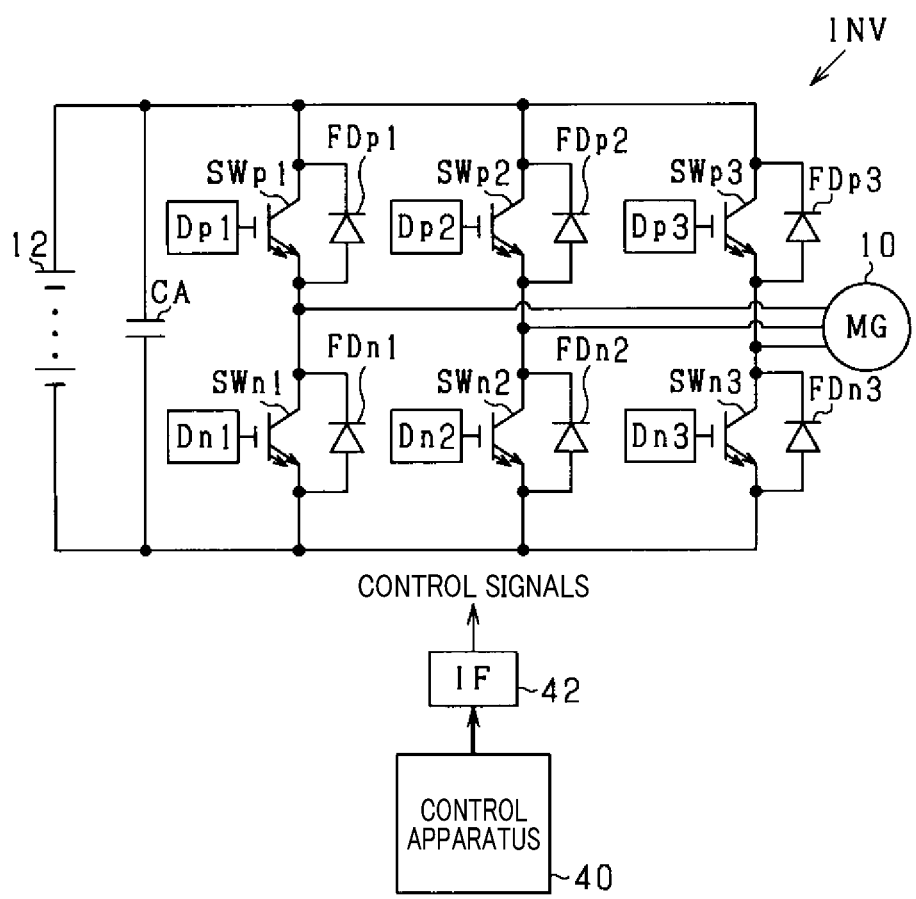
FIG. 1 illustrates an electrical configuration of an inverter apparatus.

FIG. 1 illustrates an electrical configuration of the power converter according to the present embodiment. A motor generator 10 is mechanically coupled to drive wheels and an internal combustion engine. The motor generator 10 is connected to an inverter apparatus INV. The inverter apparatus INV (power conversion circuit) receives an output voltage from a DC power supply 12 as an input voltage to convert DC power into an AC voltage. Here, the DC power supply 12 is a high-voltage battery with a high terminal voltage of, for example, 100 V or higher. The DC power supply may be a buck-boost converter or the like.

The inverter apparatus INV is configured to include a DC connection unit of three high-voltage-side switching elements SWp1 to SWp3 connected together in series (upper arm switches) and a DC connection unit of three low-voltage-side switching elements SWn1 to SWn3 connected together in series (lower arm switches), with the DC connection units being connected together in parallel. Connection points between the switching elements SWp1 to SWp3 and the switching elements SWn1 to n3 are connected to respective phases of the motor generator 10.

Each of anodes and cathodes of high-voltage-side freewheeling diodes FDp1 to FDp3 are each connected between an input terminal and an output terminal (between a collector and an emitter) of a corresponding one of the high-voltage-side switching elements SWp1 to SWp3. Each of anodes and cathodes of low-voltage-side freewheeling diodes FDn1 to FDn3 are each connected between an input terminal and an output terminal (between a collector and an emitter) of a corresponding one of the low-voltage-side switching elements SWn1 to SWn3.

A capacitor CA is a smoothing capacitor connected to the collectors (high-voltage-side terminals) of the upper arm switches SWp1 to SWp3 and to the emitters (low-voltage-side terminals) of the lower arm switches SWn1 to SWn3 to smooth the voltage between each of the high-voltage-side terminals and a corresponding one of the low-voltage-side terminals.

The semiconductor switching elements SW (SWp1 to SWp3, SWn1 to SWn3) constituting the inverter apparatus INV are all power semiconductors, and more specifically, insulated gate bipolar transistors (IGBTs).

A control apparatus 40 controls the motor generator 10. The control apparatus 40 is a microcomputer which is a digital processing means configured to control manipulate the inverter apparatus INV to adjust a controlled variable for the motor generator 10. Specifically, the control apparatus 40 controls the inverter apparatus INV by outputting control manipulation signals (outputting manipulation signals) to the switching elements SW of the inverter apparatus INV via an interface 42 including magnetic couplers Mp1 to Mp3, Mn1 to Mn3 described below and serving as insulation elements.

More specifically, the control apparatus 40 outputs control signals to drive circuits Dp1 to Dp3, Dn1 to Dn3 which input drive signals to control terminals (gates) of the respective switching elements SW via the interface 42. Here, the interface 42 includes the insulating means in order to insulate a high-voltage system including the inverter apparatus INV and the DC power supply 12 from a low-voltage system including the control apparatus 40.

The emitters of the switches SWp1 to SWp3, SWn1 to SWn3 are insulated from one another and connected to different reference potentials. Furthermore, the drive circuits Dp1 to Dp3, Dn1 to Dn3 are connected to the emitters of the switches SWp1 to SWp3, SWn1 to SWn3 to be driven by the drive circuits Dp1 to Dp3, Dn1 to Dn3, respectively. The drive circuits Dp1 to Dp3, Dn1 to Dn3 apply voltages to the gates of the switches SWp1 to SWp3, SWn1 to SWn3 to be driven by the drive circuits Dp1 to Dp3, Dn1 to Dn3, respectively, using, as reference potentials, the potentials of the emitters of the switches SWp1 to SWp3, SWn1 to SWn3 to be driven by the drive circuits Dp1 to Dp3, Dn1 to Dn3, respectively.

Figure 2:
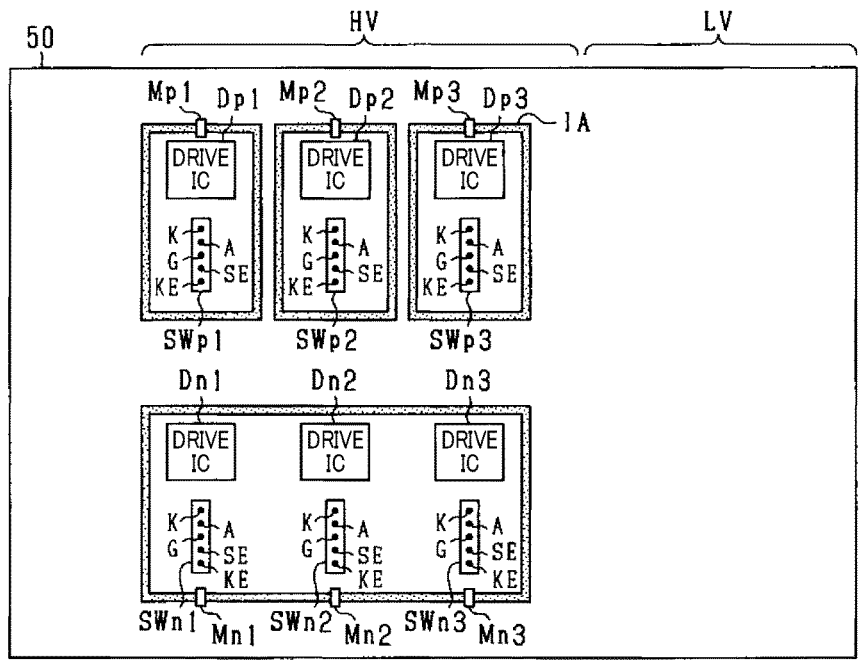
FIG. 2 is a schematic diagram illustrating a circuit board on which the inverter apparatus is mounted.

FIG. 2 illustrates a circuit board 50 on which the inverter apparatus INV according to the present embodiment is mounted. The illustrated circuit board 50 has both a high-voltage circuit area HV connected to the inverter apparatus INV and a low-voltage circuit area LV. In FIG. 2, basically, a right (a direction opposite to a direction in which the upper arm switch SWp2 is provided, with respect to the upper arm switch SWp3) area corresponds to the low-voltage circuit area LV, and a central and left (the direction in which the upper arm switch SWp2 is provided, with respect to the upper arm switch SWp3) area corresponds to the high-voltage circuit area HV. However, the high-voltage circuit area HV includes components constituting both the low-voltage system and the high-voltage system, such as the magnetic couplers Mp1 to Mp3, Mn1 to Mn3.

An electrolytic capacitor for a flyback converter (not illustrated) constituting a power supply circuit for the drive circuits Dp1 to Dp3, Dn1 to Dn3 for the switching elements SW constituting the inverter apparatus INV is provided in the low-voltage circuit area LV in the right of FIG. 2 as a component constituting the low-voltage system. Furthermore, a primary winding side of a transformer for the flyback converter (not illustrated) constituting a power supply circuit for the drive circuits Dp1 to Dp3, Dn1 to Dn3 is arranged in the low-voltage circuit area LV as a component constituting the low-voltage system, and a secondary winding side of the transformer is arranged in the high-voltage circuit area HV as a component constituting the high-voltage system.

Figure 3:
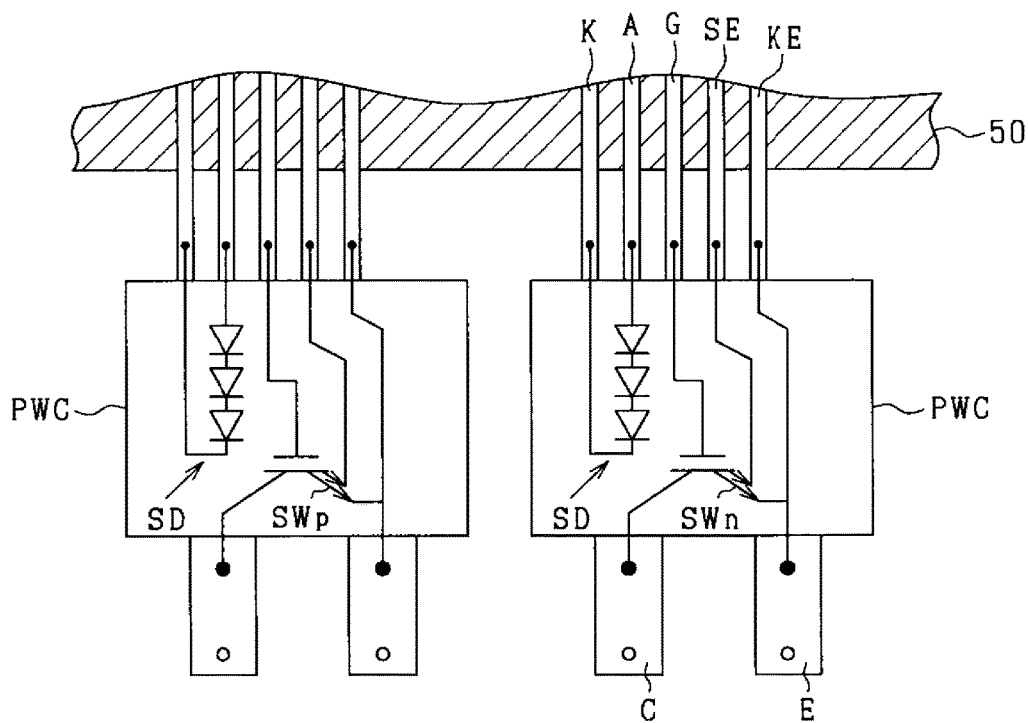
FIG. 3 is a schematic diagram illustrating a configuration of a power card (semiconductor switching element).

As illustrated in FIG. 3, the switching elements SW constituting the inverter apparatus INV are plugged into the circuit board 50 from a back surface (the back surface with respect to the surface illustrated in FIG. 2) side of the circuit board 50. Here, the switching elements SW are coated with an insulating material along with other elements to constitute power cards PWC (modules). Each of the power cards PWC includes a freewheeling diode FD and a temperature-sensitive diode SD housed therein, but illustration of the freewheeling diode FD is omitted from FIG. 3.

The power card PWC in which the high-voltage-side switching elements SWp are housed has the same structure as that of the power card PWC in which the low-voltage-side switching elements SWn are housed. Each of the power cards PWC has a plurality of signal terminals exposed from the insulating material. Specifically, a gate terminal G, an emitter detection terminal KE, and a sense terminal SE of each switching element SW, and an anode A and a cathode K of the temperature-sensitive diode SD are inserted into and connected to the circuit board 50. Here, the emitter detection terminal KE is an electrode connected to the emitter E of the switching element SW and having the same voltage as that of the emitter E. The collector detection terminal KC is an electrode connected to the collector of the switching element SW and having the same voltage as that of the collector. The sense terminal SE is a terminal configured to output a minute current having a correlation with a current flowing through the switching element SW.

As illustrated in FIG. 2, since the switching elements SW constitute the high-voltage system, the circuit board 50 is provided with insulating areas IA to insulate each of the switching elements SW from the other circuits. The insulating areas IA are areas where no circuits (elements, wires, or power supply patterns) are provided.

An upper row in FIG. 2 illustrates the terminals of the power card PWC including the upper arm switches SWp1 to SWp3, and the sets of terminals are isolated from one another by the isolated areas IA. Each of the drive circuits Dp1 to Dp3, which drive the upper arm switches SWp1 to SWp3, respectively, is mounted in the area enclosed by the corresponding insulating area IA. This is because the voltages of the emitter detection terminals KE of the upper arm switches SWp1 to SWp3 vary significantly depending on whether the corresponding lower arm switches SWn1 to SWn3 are each in an on state or in an off state. Thus, although operating voltages of the drive circuits Dp1 to Dp3 are themselves low, the drive circuits Dp1 to Dp3 need to be insulated from one another. The width of each of the insulating areas IA is determined based on legal requirements and the need to avoid dielectric breakdown.

Furthermore, a lower row in FIG. 2 illustrates the terminals of the power card PWC including the lower arm switches SWn1 to SWn3. The voltages of the emitter detection terminals KE corresponding to the lower arm switches SWn1 to SWn3 are close to one another, and thus, the insulating area IA is not provided between the lower arm switches SWn1 to SWn3. Operating voltages of components of the drive circuits Dn1 to Dn3 are themselves not necessarily high compared to operating voltages of components in the low-voltage circuit area LV. Thus, on the circuit board 50, the insulating area IA need not necessarily be provided between the drive circuits Dn1 to Dn3 of the lower arm switches SWn1 to SWn3.

However, the reference potentials of the drive circuits Dn1 to Dn3 (the potentials of emitters of the corresponding switches SWn1 to SWn3) differ from one another due to resistive and inductive components between the emitters of the switches SWn1 to SWn3 while the inverter apparatus INV is in operation. Thus, the drive circuits Dn1 to Dn3 are insulated from one another although the insulating area IA is not provided between the drive circuits Dn1 to Dn3.

Each of the drive circuits Dp1 to Dp3, Dn1 to Dn3 (hereinafter "drive circuit D") is connected to the gate terminal G and the emitter detection terminal KE of the corresponding switching element SW and applies a voltage to the gate terminal G of the switching element SW to drive the switching element SW.

The drive circuit D according to the present embodiment is connected to the sense terminal SE of the corresponding switching element SW and to the anode A and the cathode K of the temperature-sensitive diode SD. The drive circuit D detects a current flowing through the switching element SW based on the voltage value of the sense terminal SE. The drive circuit D also detects the temperature of the switching element SW based on the voltage between the anode A and the cathode K of the temperature-sensitive diode SD. Additionally, the drive circuit D determines abnormality of the switching element SW based on a detected value of the current flowing through the switching element SW and a detected value of the temperature of the switching element SW. The drive circuit D then transmits first information and second information to the control apparatus 40. The first information is a signal indicative of a numerical value. Specifically, the first information is temperature information numerically indicating the temperature of the switching element SW corresponding to the drive circuit D. Alternatively, the first information may be information indicative of the magnitude of the voltage between the input terminal and the output terminal of the switching element SW or information indicative of the magnitude of a current flowing between the input terminal and the output terminal of the switching element SW. The second information is information indicative of one of two types of states. Specifically, the second information is abnormality information indicating whether the switching element SW corresponding to the drive circuit D is normal or abnormal.

As described above, the drive circuit D and the control apparatus 40 are connected together via the interface 42. More specifically, the drive circuit D and the control apparatus 40 are connected together via the magnetic couplers Mp1 to Mp3, Mn1 to Mn3 (hereinafter "magnetic coupler M") constituting the interface 42. The present embodiment is configured in such a manner that the signal indicative of the temperature information and the signal indicative of the abnormality information are transmitted from the drive circuit D to the control apparatus 40 via the same magnetic coupler M in order to reduce the number of the magnetic couplers M used in the signal transmission circuit having the drive circuit D and the control apparatus 40.

The magnetic coupler M is a type of insulation element. The insulation element refers to an element which insulates a reception side and a transmission side of the insulation element from each other and which transmits a signal received from an element on the reception side to an element on the transmission side. The magnetic coupler magnetically couples the reception side and the transmission side together to insulate the transmission side and the reception side of the insulation element from each other, and transmits a signal received from the reception-side element to the transmission-side element. For example, the magnetic coupler is an element which magnetically couples the reception side and the transmission side together, and has a reception coil provided on the reception side and a transmission coil provided on the transmission side. A current (signal) is passed through the reception coil of the magnetic coupler M to vary a magnetic field, thus varying the current flowing through the transmission coil or the voltage across the transmission coil. Consequently, the signal received from the reception-side element is transmitted to the transmission-side element. Furthermore, for example, the magnetic coupler M has a reception coil provided on the reception side and a magnetoresistive effect element provided on the transmission side, as elements which magnetically couple the reception side and the transmission side together. A current (signal) is passed through the reception coil of the magnetic coupler to vary a magnetic field, varying the resistance of the magnetoresistive effect element and thus the current or voltage on the transmission side. Consequently, the signal received from the reception-side element is transmitted to the transmission-side element.

Figure 4:
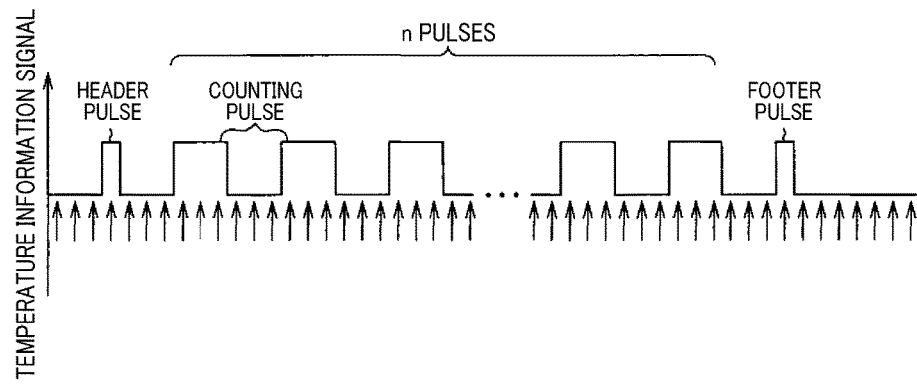
FIG. 4 is a timing diagram representing a temperature information signal according to a first embodiment.

FIG. 4 illustrates a signal (first signal) indicative of temperature information transmitted to the control apparatus 40 serving as a "reception apparatus", by the drive circuit D serving as a "transmission apparatus". In the present embodiment, the drive circuit D transmits a header pulse indicative of the start of the signal indicative of the temperature information. The temperature information is then transmitted based on the number of (in FIG. 4, n) pulses consecutively outputted with a predetermined period and having a first waveform with a duty cycle (duty ratio) of less than 100%. The pulses the number of which is indicative of the temperature information are hereinafter "counting pulses". Subsequently, a footer pulse is transmitted which indicates the end of the signal indicative of the temperature information. For example, the drive circuit D outputs 300 counting pulses between the header pulse and the footer pulse when the temperature of the switching element SW is 30.0 degrees, and outputs 605 counting pulses between the header pulse and the footer pulse when the temperature of the switching element SW is 60.5 degrees. The control apparatus 40 acquires the temperature information by counting the number of counting pulses during a period between the header pulse and the footer pulse. The control apparatus 40 periodically acquires a voltage value of the input signal with a predetermined period (as illustrated by arrows in FIG. 4).

The counting pulse has a wavelength (duration) different from the wavelength of the header pulse and the footer pulse. Specifically, the wavelength of the header pulse and the footer pulse is set shorter than the wavelength of the counting pulse. Furthermore, in the example illustrated in FIG. 4, rectangular waves (square waves) are used as the counting pulse, the header pulse, and the footer pulse. However, the pulses may be triangular waves, sawtooth waves, or sinusoidal waves (sine waves).

Figure 5:
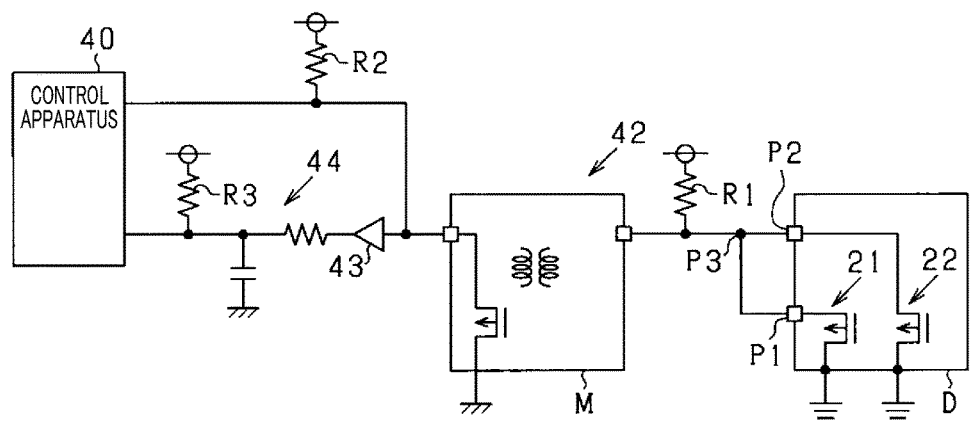
FIG. 5 is a circuit diagram illustrating connection between a driving apparatus and a control apparatus according to the first embodiment.

The drive circuit D transmits the signal indicative of the abnormality information by modifying the waveform of the counting pulse. The drive circuit D of the present embodiment transmits the signal indicative of the abnormality information (second signal) using a pulse having a longer wavelength (longer duration) than the counting pulse. Specifically, the drive circuit D transmits, to the control apparatus 40, information indicating that an abnormality has occurred in the switching element SW by transmitting the pulse having a longer wavelength (longer duration) than the counting pulse. FIG. 5 illustrates a circuit diagram representing the connection between the drive circuit D and the control apparatus 40 according to the present embodiment.

A temperature information transmission unit 21 (first transmission unit) in the drive circuit D transmits the signal indicative of the temperature information to the control apparatus 40 via the magnetic coupler M. An abnormality information transmission unit 22 (second transmission unit) in the drive circuit D transmits the signal indicative of the abnormality information to the control apparatus 40 via the magnetic coupler M. In this case, the abnormality information transmission unit 22 transmits, as an output signal, a pulse having a longer wavelength (longer duration) than the counting pulse transmitted by the temperature information transmission unit 21, and modifies the waveform of the pulses indicative of the temperature information by performing a logical OR operation of the output signal from the abnormality information transmission unit 22 and the output signal from the temperature information transmission unit 21.

Both the temperature information transmission unit 21 and the abnormality information transmission unit 22 output the signals based on negative logic (active low). Furthermore, both the temperature information transmission unit 21 and the abnormality information transmission unit 22 have an open drain output (or an open collector output). Thus, a wired OR configuration is achieved by connecting an output (terminal P1) of the temperature information transmission unit 21 and an output (terminal P2) of the abnormality information transmission unit 22 together (at a connection point P3) on a drive circuit D side with respect to the magnetic coupler M. The output of the temperature information transmission unit 21 and the output of the abnormality information transmission unit 22 are connected together and to a pull-up resistor R1 in such a manner that outputs from the temperature information transmission unit 21 and the abnormality information transmission unit 22 are inputted to the magnetic coupler M.

A signal operated a logical OR of the output signal from the temperature information transmission unit 21 and the output signal from the abnormality information transmission unit 22 is inputted to a buffer 43 and a low-pass filter 44 via the magnetic coupler M. An input of the buffer 43 and an output of the low-pass filter 44 are connected to pull-up resistors R2, R3, respectively. The control apparatus 40 serving as a "first reception unit" acquires the temperature information via the buffer 43, and the control apparatus 40 serving as a "second reception unit" acquires the abnormality information via the low-pass filter 44.

Figure 6:
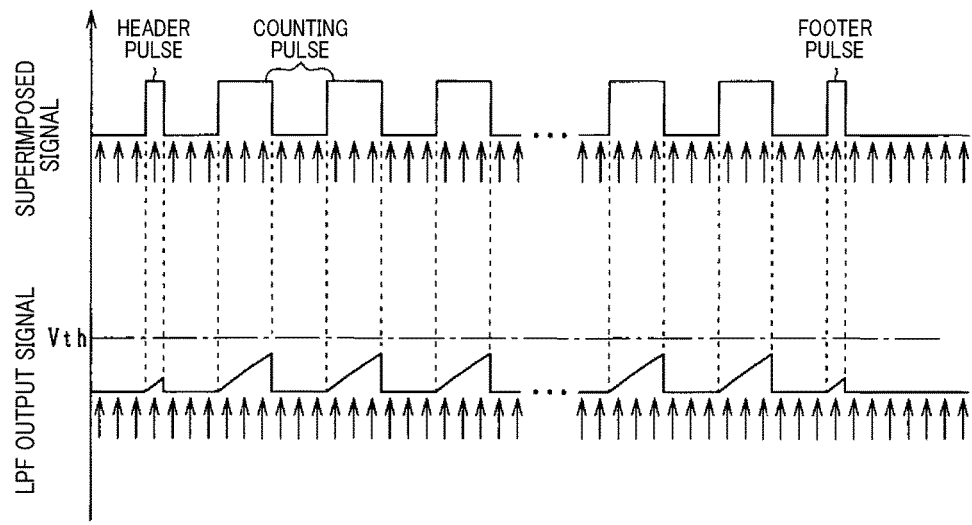
FIG. 6 is a timing diagram illustrating an output signal from a low-pass filter in a normal state.
Figure 7:
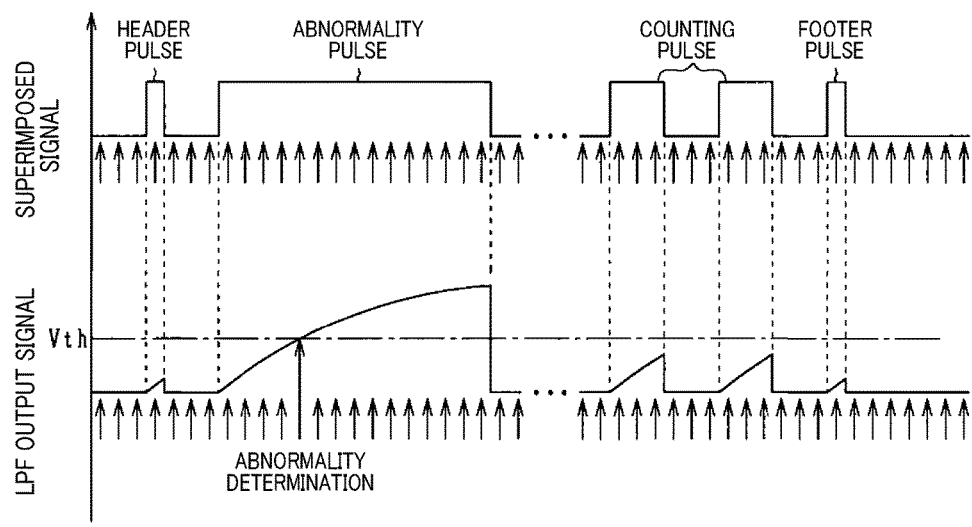
FIG. 7 is a timing diagram illustrating an output signal from the low-pass filter in an abnormal state.

Acquisition of the abnormality information by the control apparatus 40 will be described with reference to FIG. 6 and FIG. 7.

When the switching element SW is normal, counting pulses each with a predetermined wavelength (predetermined duration) are consecutively inputted to the low-pass filter 44. As illustrated in FIG. 6, in response to the input of the counting pulses, the signal inputted to the low-pass filter 44 is set to a high state to cause an output voltage from the low-pass filter 44 to start increasing. Subsequently, when a time corresponding to the wavelength of the counting pulse has elapsed, the signal inputted to the low-pass filter 44 is set to a low state to reduce the output voltage from the low-pass filter 44.

Here, a time constant for the low-pass filter 44 is set to inhibit the output voltage from the low-pass filter 44 from exceeding a predetermined threshold voltage Vth when the counting pulses with the predetermined wavelength indicating the temperature information are inputted to the low pass filter 44. A resistance value of the pull-up resistor R3 is set smaller than a resistance value of a resistor of the low-pass filter 44 to allow falling of the output signal from the low-pass filter 44 to occur more rapidly than rising of the output signal from the low-pass filter 44.

When the switching element SW is abnormal, a pulse having a longer wavelength (longer duration) than the counting pulse is inputted to the low-pass filter 44. As illustrated in FIG. 7, in response to the input of the pulse indicative of the abnormality information, the signal inputted to the low-pass filter 44 is set to the high state to cause the output voltage of the low-pass filter 44 to start to increase. Subsequently, the output voltage from the low-pass filter 44 exceeds the predetermined threshold voltage Vth. The control apparatus 40 determines whether a state indicated by the abnormality information (second information) has been switched based on whether the voltage value of the signal received from the low-pass filter 44 is equal to or higher than the threshold voltage Vth. That is, the control apparatus 40 can determine that abnormality has occurred in the switching element SW based on the output voltage from the low-pass filter 44 exceeding the predetermined threshold voltage Vth. In the present embodiment, the wavelength (duration) of the pulse indicative of the abnormality information which is outputted from the abnormality information transmission unit 22 is set longer than an output period of the counting pulses.

Advantageous effects of the present embodiment will be described below.

In the configuration in PTL 1, first information (temperature information) is indicated by a time ratio of a pulse signal. Furthermore, second information (abnormality information) having a higher degree of urgency than the first information is indicated by a pulse signal having a shorter wavelength (shorter duration) than the signal indicative of the first information. The signal indicative of the first information and the signal indicative of the second information are superimposed on each other. Then, two signals are obtained by applying a low-pass filter to the superimposed signal and by applying a delay circuit to the superimposed signal, and compared with each other to restore the signal indicative of the second information.

In this case, a reduced time constant for the low-pass filter leads to an increased number of times of erroneous detection of the second information by the control apparatus due to possible noise in a signal transmission path. On the other hand, an increased time constant for the low-pass filter disadvantageously delays transmission of the second information and causes interference between the first information and the second information.

In the configuration of the present embodiment, the abnormality information (second information) can be transmitted from the drive circuit D to the control apparatus 40 at a speed corresponding to one period of the counting pulse. Thus, presetting a short period for the counting pulse increases a transmission speed for the abnormality information. The configuration of the present embodiment also inhibits possible interference between the signal indicative of the temperature information (first information) and the signal indicative of the abnormality information. Thus, the abnormality information is transmitted more quickly than the temperature information and with no errors.

In general, variations in the temperature of the switching element SW are slow compared to the speed of signal transmission between the drive circuit D and the control apparatus 40. Furthermore, the abnormality information on the switching element SW is desirably transmitted and received as quickly as possible. Thus, the present embodiment is configured to transmit the temperature information as the first information and the abnormality information as the second information.

Specifically, the present embodiment is configured to transmit the abnormality information as the second information by varying the wavelength (duration) of the counting pulse. Consequently, in the configuration including, as the insulation element, the magnetic coupler M transmitting digital signals, the signals can be transmitted from the drive circuit D to the control apparatus 40.

The reception unit of the control apparatus 40 of the present embodiment is separated into a system which receives the signal indicative of the temperature information (first reception unit) and a system which receives the signal indicative of the abnormality information (second reception unit). Provision of the separate systems receiving the signal indicative of the abnormality information and the signal indicative of the temperature information, respectively, enables a logic circuit such as an OR circuit or an AND circuit to aggregate signals indicative of abnormality information on a plurality of switching elements or signals indicative of abnormality information on a plurality of power converters. Moreover, the configuration of a logic circuit to which the signal indicative of the abnormality information is inputted is modified according to the configuration of a power supply system including the power converter, thus enabling modification of operations of the power supply system in a case of abnormality.

Figure 8:
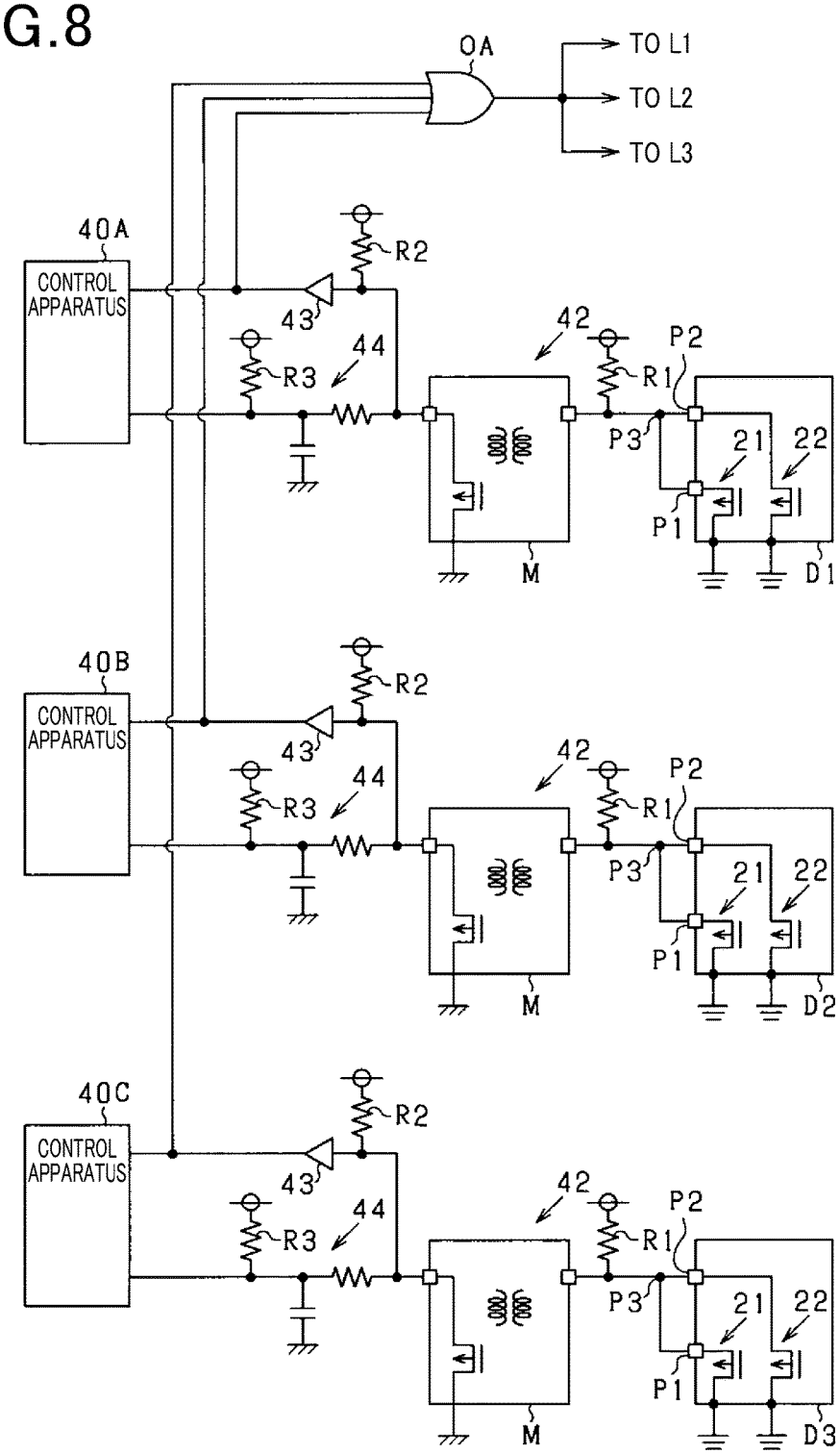
FIG. 8 is a circuit diagram illustrating a configuration where a logic circuit aggregates signals indicative of abnormality information each of which is outputted from a corresponding one of a plurality of power converters.
Figure 9:
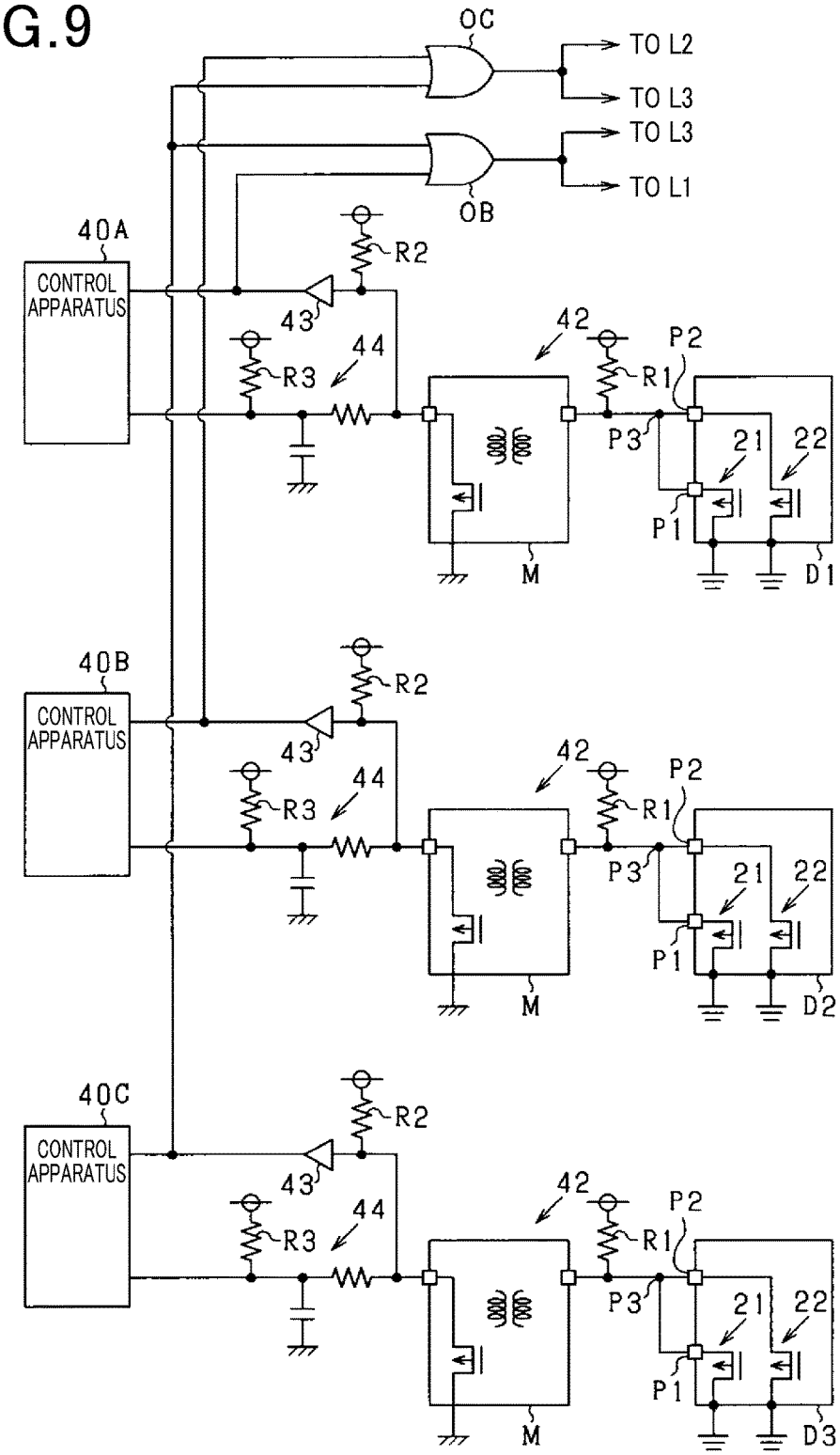
FIG. 9 is a circuit diagram illustrating a configuration where the logic circuit aggregates signals indicative of abnormality information each of which is outputted from a corresponding one of the plurality of power converters.

For example, in a power supply system including inverter circuits each supplying power to a corresponding one of a plurality of electric rotating machines and converter circuits each boosting power supplied by a battery to output the resultant power to a corresponding one of the plurality of inverter circuits, a logic circuit can be used to aggregate signals indicative of the abnormality information each of which is outputted from a corresponding one of the plurality of inverter circuits and converter circuits. FIGS. 8 and 9 illustrate configurations where a logic circuit aggregates signals indicative of the abnormality information each of which is outputted from a corresponding one of a plurality of power converters. In FIGS. 8 and 9, the same components as those in FIG. 5 are denoted by the same reference numerals as those in FIG. 5, and description of these components is omitted as needed.

For example, in the configuration illustrated in FIG. 8, a drive circuit D1 driving switching elements provided in a first inverter circuit (not illustrated) transmits a signal indicative of the temperature information and a signal indicative of the abnormality information to a control apparatus 40A which controls the first inverter circuit. Furthermore, a drive circuit D2 driving switching elements provided in a second inverter circuit (not illustrated) transmits a signal indicative of the temperature information and a signal indicative of the abnormality information to a control apparatus 40B which controls the second inverter circuit. Additionally, a drive circuit D3 driving switching elements provided in a converter circuit (not illustrated) transmits a signal indicative of the temperature information and a signal indicative of the abnormality information to a control apparatus 40C which controls the converter circuit.

An OR circuit OA receives the signal indicative of the abnormality information which is outputted from the drive circuit D1 and inputted to the control apparatus 40A via the low-pass filter 44, the signal indicative of the abnormality information which is outputted from the drive circuit D2 and inputted to the control apparatus 40B via the low-pass filter 44, and the signal indicative of the abnormality information which is outputted from the drive circuit D3 and inputted to the control apparatus 40C via the low-pass filter 44. In other words, the signals indicative of the abnormality information which are outputted from the drive circuits D1 to D3 are inputted to the OR circuit OA after being filtered by the low-pass filter 44.

In the configuration illustrated in FIG. 8, an output from the OR circuit OA is inputted to a switch L1 which connects power supply from a voltage source to control terminals of the switching elements of the first inverter circuit and which disconnects the power supply from the control terminals. Furthermore, the output from the OR circuit OA is inputted to a switch L2 which connects power supply from the voltage source to control terminals of the switching elements of the second inverter circuit and which disconnects the power supply from the control terminals. The output from the OR circuit OA is inputted to a switch L3 which connects power supply from the voltage source to control terminals of the switching elements of the converter circuit and which disconnects the power supply from the control terminals. The switches L1 to L3 are, for example, semiconductor switching elements or mechanical relay switches.

When the OR circuit OA receives a pulse indicative of occurrence of an abnormality which is outputted from any of the drive circuit D1 corresponding to the first inverter circuit, the drive circuit D2 corresponding to the second inverter circuit, and the drive circuit D3 corresponding to the converter circuit, the output from the OR circuit OA is set to the high state. This in turn sets all the switches L1 to L3 to a disconnected state (off state). In other words, if an abnormality occurs in any of the first and second inverter circuits and the converter circuit, the operations of all of the first and second inverter circuits and the converter circuit are immediately stopped.

Unlike in the configuration illustrated in FIG. 8, in the configuration illustrated in FIG. 9, an OR circuit OB receives the signal indicative of the abnormality information which is outputted from the drive circuit D1 and inputted to the control apparatus 40A via the low-pass filter 44 and the signal indicative of the abnormality information which is outputted from the drive circuit D3 and inputted to the control apparatus 40C via the low-pass filter 44. In other words, the signals indicative of the abnormality information which are outputted from the drive circuits D1, D3 are inputted to the OR circuit OB after being filtered by the low-pass filter 44. Furthermore, an OR circuit OC receives the signal indicative of the abnormality information which is outputted from the drive circuit D2 and inputted to the control apparatus 40B via the low-pass filter 44 and the signal indicative of the abnormality information which is outputted from the drive circuit D3 and inputted to the control apparatus 40C via the low-pass filter 44. In other words, the signals indicative of the abnormality information which are outputted from the drive circuits D2, D3 are inputted to the OR circuit OC after being filtered by the low-pass filter 44.

In the configuration illustrated in FIG. 9, an output from the OR circuit OB is inputted to the switches L1, L3. An output from the OR circuit OC is inputted to the switches L2, L3. When the OR circuit OB receives a pulse indicative of occurrence of an abnormality which is outputted from any of the drive circuit D1 corresponding to the first inverter circuit or the drive circuit D3 corresponding to the converter circuit, the output from the OR circuit OB is set to the high state. This in turn sets both the switches L1, L3 to the disconnected state (off state). In other words, if an abnormality occurs in the first inverter circuit or the converter circuit, the operation of each of the first inverter circuit and the converter circuit is immediately stopped. Furthermore, when the OR circuit OC receives a pulse indicative of occurrence of an abnormality which is outputted from the drive circuit D2 corresponding to the second inverter circuit or the drive circuit D3 corresponding to the converter circuit, the output from the OR circuit OC is set to the high state. This sets both the switches L2, L3 to the disconnected state (off state). In other words, if an abnormality occurs in the second inverter circuit or the converter circuit, the operation of each of the second inverter circuit and the converter circuit is immediately stopped.

As described above, in the configuration illustrated in FIG. 8, if an abnormality occurs in any of the first and second inverter circuits and the converter circuit, the operations of all of the first and second inverter circuits and the converter circuit are immediately stopped. In the configuration illustrated in FIG. 9, if an abnormality occurs in the first inverter circuit or the converter circuit, the operation of each of the first inverter circuit and the converter circuit is immediately stopped. If an abnormality occurs in the second inverter circuit or the converter circuit, the operation of each of the second inverter circuit and the converter circuit is immediately stopped. That is, in the configuration illustrated in FIG. 8, if an abnormality occurs in any of the first and second inverter circuits and the converter circuit, the operations of all of the first and second inverter circuits and the converter circuit are immediately stopped to allow safety to be improved. Furthermore, in the configuration illustrated in FIG. 9, if an abnormality occurs in one of the first inverter circuit and the second inverter circuit, the operation of the inverter circuit in which the abnormality has occurred is immediately stopped, whereas the operation of the inverter circuit in which no abnormality has occurred is continued. In other words, one of the two electric rotating machines can continue operating.

The temperature information transmission unit 21 of the drive circuit D of the present embodiment outputs information to the control apparatus 40 based on the negative logic. Thus, the abnormality information transmission unit 22 is configured to output a low-state signal for a duration longer than a duration when the counting pulses are in the low state, and the drive circuit D is configured to perform a logical OR operation of the signal outputted by the abnormality information transmission unit 22 and the signal outputted by the temperature information transmission unit 21. Such a configuration makes the wavelength (duration) of the pulse of the superimposed signal inputted to the control apparatus 40 longer than the wavelength of the counting pulse if an abnormality occurs in the switching element SW. Thus, the control apparatus 40 can determine the occurrence of the abnormality in a time equivalent to the wavelength of the counting pulse.

In the configuration of the present embodiment, when digital information is transmitted and received via an insulation element, the magnetic coupler M is used as the insulation element. This produces a power consumption reduction effect.

Second Embodiment

Figure 10:
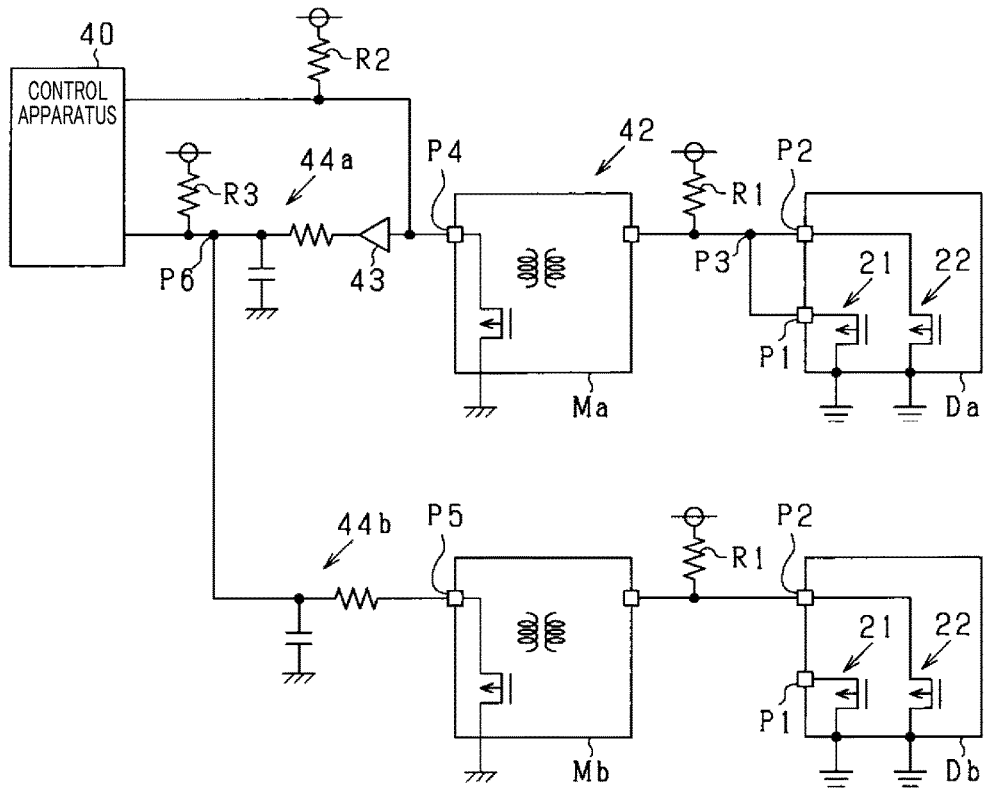
FIG. 10 is a circuit diagram illustrating connection between a driving circuit and a control apparatus according to a second embodiment.

FIG. 10 illustrates a circuit diagram representing connections between drive circuits Da, Db and the control apparatus 40 according to a second embodiment. Here, the drive circuits Da, Db are any two of the drive circuits Dp1 to Dp3, Dn1 to Dn3.

The first drive circuit Da (first transmission apparatus) is configured to transmit the temperature information and the abnormality information to the control apparatus 40 (reception apparatus), and the second drive circuit Db (second transmission apparatus) is configured to transmit only the abnormality information to the control apparatus 40. More specifically, an output terminal P1 of the temperature information transmission unit 21 of the second drive circuit Db is set to a float state where the output terminal P1 is connected to no external apparatus, thus disabling the temperature information transmission unit 21 of the second drive circuit Db.

The outputs from the temperature information transmission unit 21 and abnormality information transmission unit 22 of the first drive circuit Da are subjected to a logical OR operation, and the result is inputted to a magnetic coupler Ma (first insulation element). Furthermore, the output from the abnormality information transmission unit 22 of the second drive circuit Db is inputted to a magnetic coupler Mb (second insulation element).

An output from the magnetic coupler Ma is inputted via the buffer 43 to the control apparatus 40 serving as the first reception unit. Furthermore, the output (terminal P4) of the magnetic coupler Ma and an output (terminal P5) of the magnetic coupler Mb are connected together at a connection point P6 via the low-pass filters 44a, 44b, respectively, in such a manner that outputs from the magnetic couplers Ma and Mb are subjected to a logical OR operation. The result of the logical OR operation is inputted to the control apparatus 40 serving as the second reception unit. In other words, a transmit signal from the first drive circuit Da and a transmit signal from the second drive circuit Db are subjected to a logical OR operation on the control apparatus 40 side with respect to the magnetic couplers Ma, Mb. In the present configuration, the connection point P6 may be provided on the terminals P4, P5 side with respect to the low-pass filters 44a, 44b.

In the above-described configuration, the temperature information (first information) is common information relating to the entire apparatus, and the plurality of different pieces of abnormality information (second information) are transmitted and received in the apparatus. This enables the temperature information and the plurality of pieces of abnormality information to be transmitted from the drive circuits Da, Db to the control apparatus 40 while reducing the number of magnetic couplers M used. In this case, the plurality of switching elements SW constituting the inverter apparatus INV can be considered to have substantially the same temperature, and thus, the present configuration may acquire the temperature information from only one switching element SW.

Other Embodiments

Figure 11:
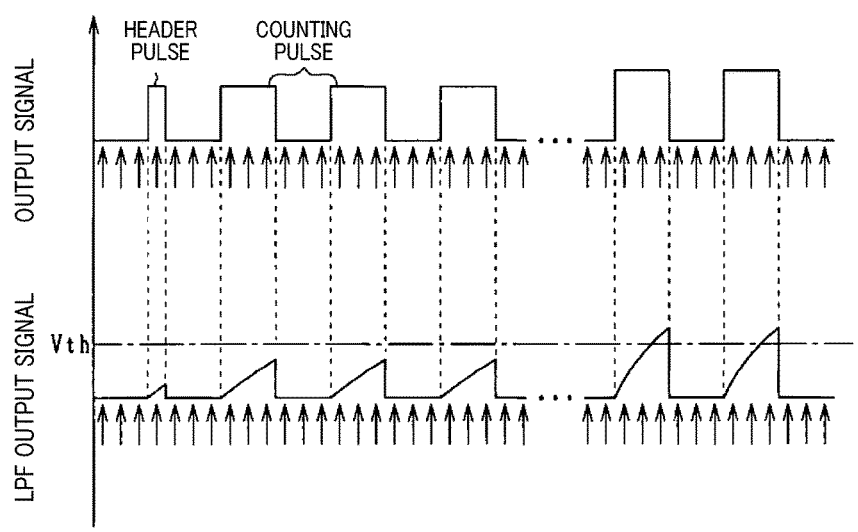
FIG. 11 is a timing diagram illustrating an output signal from the low-pass filter in a case where an abnormality occurs in a switching element according to a variation.

In another example of pulse modification, the amplitude of the counting pulse may be varied. FIG. 11 illustrates a specific example of a signal outputted from the drive circuit D. The drive circuit D increases the amplitude of the counting pulse if an abnormality occurs in the switching element SW. Consequently, the output from the low-pass filter 44 exceeds the threshold voltage Vth, allowing the control apparatus 40 to determine the occurrence of an abnormality. This configuration transmits the signal indicative of the abnormality information based on the magnitude of an analog value. Thus, using a magnetic coupler or a photocoupler, which transmits digital signals, as the insulation element, is inappropriate, and a transformer or the like may be used as the insulation element.

In the configuration varying the amplitude of the counting pulse, the abnormality information (second information) can be instantaneously acquired by omitting the low-pass filter 44 and configuring the control apparatus 40 to detect the voltage value (analog value) of the input signal.

In the above-described configuration, the drive circuit D outputs signals based on the negative logic. In a variation of this configuration, the signals may be outputted based on positive logic. In that case, the abnormality information transmission unit 22 can modify the waveform of the counting pulse by performing a logical OR operation of the output signal from the temperature information transmission unit 21 and a high-state signal which lasts for a duration longer than a duration when the counting pulses outputted by the temperature information transmission unit 21 are in the high state.

Figure 12:
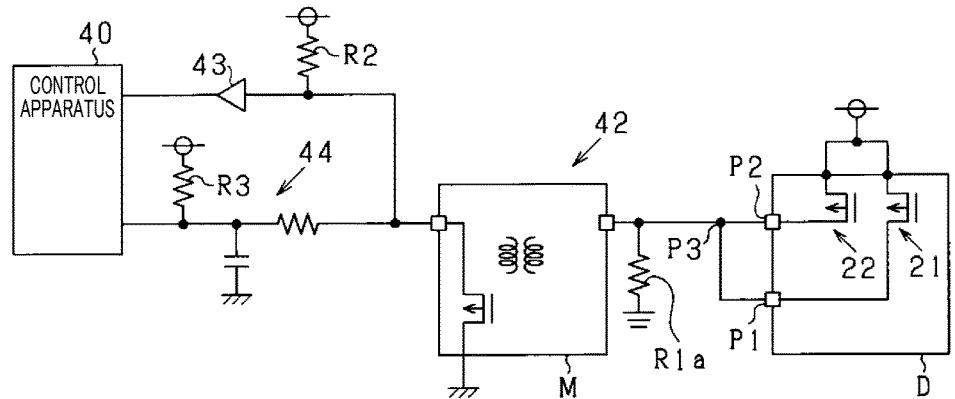
FIG. 12 is a circuit diagram illustrating connection between a driving circuit and a control apparatus according to the variation.

FIG. 12 illustrates a circuit diagram representing connection between the drive circuit D and the control apparatus 40 according to a variation of the embodiment. In FIG. 12, the same components as those in FIG. 5 are denoted by the same reference numerals as those in FIG. 5, and description of these components is omitted as needed. Both the temperature information transmission unit 21 and the abnormality information transmission unit 22 according to the present variation output signals based on the positive logic (active high). Furthermore, both the temperature information transmission unit 21 and the abnormality information transmission unit 22 have an open source output (or an open emitter output). Thus, a wired OR configuration is achieved by connecting the output (terminal P1) of the temperature information transmission unit 21 and the output (terminal P2) of the abnormality information transmission unit 22 together at the connection point P3 on the drive circuit D side with respect to the magnetic coupler M. The output of the temperature information transmission unit 21 and the output of the abnormality information transmission unit 22 are connected together at the connection point P3, which is connected to a pull-down resistor R1a, in such a manner that outputs from the temperature information transmission unit 21 and the abnormality information transmission unit 22 are inputted to the magnetic coupler M.

The configuration illustrated in FIG. 5 is applied when the input-side logic of the magnetic coupler M (the output-side logic of the drive circuit D) uses negative logic, and the configuration illustrated in FIG. 12 is applied when the input-side logic of the magnetic coupler M (the output-side logic of the drive circuit D) uses positive logic. Then, regardless of whether the input-side logic of the magnetic coupler M is the negative logic or the positive logic, the signals indicative of the temperature information and the abnormality information can be transmitted. The magnetic coupler M may output signals based on the negative logic.

Figure 13:
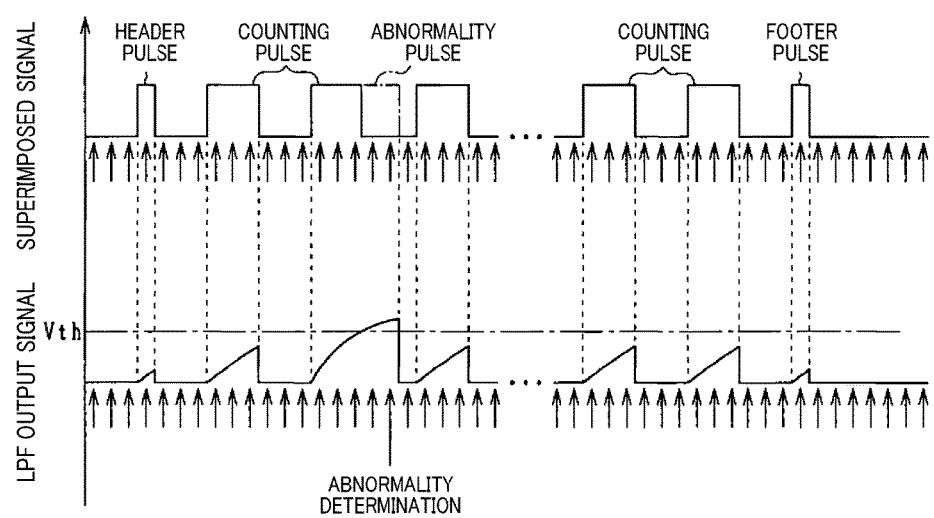
FIG. 13 is a timing diagram illustrating an output signal from the low-pass filter according to the variation.

In the above-described embodiment, the wavelength (duration) of the pulse indicative of the abnormality information which is outputted from the abnormality information transmission unit 22 is set longer than the output period of the counting pulse. Alternatively, as illustrated in FIG. 13, the abnormality information transmission unit 22 in the present variation transmits the pulse indicative of the abnormality information in synchrony with the counting pulse, and also transmits the signal indicative of the abnormality information using a pulse with a wavelength (duration) longer than the wavelength of the counting pulse and shorter than the period with which the counting pulses are consecutively outputted. According to the configuration of the present variation, even if the pulse indicative of the abnormality information is superimposed on the counting pulse, the control apparatus 40 can acquire the temperature information indicated by the number of counting pulses.

In the configuration of the second embodiment where each of the abnormality information transmission units 22 of the plurality of drive circuits Da, DB outputs the signal indicative of the abnormality information, the drive circuits Da, Db may be configured to synchronize with each other. This configuration allows the control apparatus 40 to acquire the temperature information indicated by the number of counting pulses, even if the pulse indicative of the abnormality information which is outputted from the abnormality information transmission unit 22 of the second drive circuit Db is superimposed on the counting pulse outputted from the temperature information transmission unit 21 of the first drive circuit Da.

A synchronization signal (clock signal) synchronizing the first drive circuit Da with the second drive circuit Db is outputted from the control apparatus 40 and inputted to the first drive circuit Da and to the second drive circuit Db via the magnetic couplers Ma, Mb, respectively. Here, the synchronization signal synchronizing the first drive circuit Da with the second drive circuit Db may be outputted from the first drive circuit Da and inputted to the second drive circuit Db via the magnetic couplers Ma, Mb. Alternatively, the synchronization signal synchronizing the first drive circuit Da with the second drive circuit Db may be outputted from the second drive circuit Db and inputted via the magnetic couplers Ma, Mb to the first drive circuit Da.

In the above-described configuration, the power converter in which the signal transmission circuit is employed is an inverter apparatus. Alternatively, the signal transmission circuit may be employed in a power converter such as a DC-DC converter.

In the above-described configuration, a logical OR operation is performed based on the wired OR. However, in an alternative configuration, the logical OR operation may be performed using a logic circuit.

The magnetic coupler may be replaced with a capacitive coupler. A capacitive coupler capacitively couples the reception side and the transmission side together to insulate the reception side and the transmission side of the insulation element from each other, and transmits the signal received from the reception-side element to the transmission-side element. The capacitive coupler has, for example, a capacitor as an element which capacitively couples the reception side and the transmission side together.

The present disclosure has been described in accordance with the embodiments. However, it may be comprehended that the present disclosure is not limited to the above-described embodiments or structures. The present disclosure includes many variations, and modifications within the range of equivalency. In addition, various combinations or forms of elements and even other combinations or forms including one or more elements or one or less component fall within the scope and spirits of the present disclosure.

The invention claimed is:

1. A signal transmission circuit comprising a transmission apparatus and a reception apparatus which are insulated from each other and between which a signal indicative of predetermined information is transmitted via an insulation element,
   wherein the transmission apparatus includes a first transmission unit transmitting a first signal indicative of first information based on the number of pulses consecutively outputted with a predetermined period and each having a first waveform with a duty cycle of less than 100% with respect to the period and a second transmission unit transmitting a second signal indicative of second information based on a pulse having a longer wavelength than the first waveform,
   wherein the first transmission unit transmitting the first signal to the reception apparatus and the second transmission unit transmitting the second signal to the reception apparatus, via the insulation element common to the first transmission unit and the second transmission unit, and
   wherein the second transmission unit transmits the second signal in synchrony with the pulse having the first waveform, and transmits the second signal indicative of the second information using a pulse having a wavelength which is longer than the first waveform and which is shorter than a period during which the pulse having the first waveform is consecutively outputted.

2. The signal transmission circuit according to claim 1, which is used for a power converter (INV), wherein
   the first transmission unit transmits, as the first information, temperature information indicative of a temperature of a semiconductor switching element (SW, SWp1 to SWp3, SWn1 to SWn3) comprising the power converter, and
   the second transmission unit transmits, as the second information, abnormality information indicating that an abnormality has occurred in the semiconductor switching element.

3. The signal transmission circuit according to claim 2, wherein
   the transmission apparatus is a drive circuit for the semiconductor switching element, and
   the reception apparatus is a control apparatus for the power converter.

4. The signal transmission circuit according to claim 1, wherein
   the transmission apparatus outputs a signal based on negative logic, and
   the first signal outputted from the first transmission unit and the second signal outputted from the second transmission unit are subjected to a logical OR operation on the transmission apparatus side with respect to the insulation element, and a result of the logical OR operation is inputted to the insulation element.

5. The signal transmission circuit according to claim 4, wherein
   the second information is information indicative of one of two types of states, and a low-pass filter with a predetermined time constant is provided between the reception apparatus and the insulation element, and
   the reception apparatus receives, via the insulation element and the low-pass filter, the signal produced by performing a logical OR operation on the first signal outputted from the first transmission unit and the second signal outputted from the second transmission unit, and determines whether the state indicated by the second information has been switched based on whether a voltage value of the signal received from the low-pass filter is equal to or higher than a predetermined threshold voltage.

6. The signal transmission circuit according to claim 4, wherein the transmission apparatus includes a first transmission apparatus including both the first transmission unit and the second transmission unit and a second transmission apparatus including the second transmission unit,
   wherein the first transmission apparatus and the second transmission apparatus are insulated from each other,
   a first insulation element is provided between the first transmission apparatus and the reception apparatus and a second insulation element is provided between the second transmission apparatus and the reception apparatus, and
   a signal outputted from the first transmission apparatus and a signal outputted from the second transmission apparatus are subjected to a logical OR operation on the reception apparatus side with respect to the first insulation element and the second insulation element, and a result of the logical OR operation is outputted to the reception apparatus.

7. The signal transmission circuit according to claim 1, wherein the transmission apparatus outputs a signal based on positive logic, and the first signal outputted from the first transmission unit and the second signal outputted from the second transmission unit are subjected to a logical OR operation on the transmission apparatus side with respect to the insulation element, and a result of the logical OR operation is inputted to the insulation element.

8. The signal transmission circuit according to claim 1, wherein a magnetic coupler is used as the insulation element.

9. The signal transmission circuit according to claim 1, wherein the reception apparatus comprises a first reception unit receiving the first signal from the first transmission unit and a second reception unit receiving the second signal from the second transmission unit.

* * * * *